US009829797B2

(12) United States Patent
Lee et al.

(10) Patent No.: US 9,829,797 B2
(45) Date of Patent: Nov. 28, 2017

(54) CLEANING COMPOSITION FOR PHOTOLITHOGRAPHY AND METHOD OF FORMING PHOTORESIST PATTERN USING THE SAME

(71) Applicant: YOUNG CHANG CHEMICAL CO., LTD., Seongju-gun, Gyeongsangbuk-do (KR)

(72) Inventors: Seung Hun Lee, Daegu (KR); Seung Hyun Lee, Daegu (KR); Sang Woong Yoon, Seoul (KR); Gyeong Guk Ham, Daegu (KR)

(73) Assignee: YOUNG CHANG CHEMICAL CO., LTD, Seongju (KR)

( * ) Notice: Subject to any disclaimer, the term of this patent is extended or adjusted under 35 U.S.C. 154(b) by 0 days.

(21) Appl. No.: 15/181,521

(22) Filed: Jun. 14, 2016

(65) Prior Publication Data

US 2017/0017161 A1 Jan. 19, 2017

(30) Foreign Application Priority Data

Jul. 17, 2015 (KR) .................. 10-2015-0101689

(51) Int. Cl.
| | | |
|---|---|---|
| *G03F 7/004* | (2006.01) | |
| *G03F 7/40* | (2006.01) | |
| *C11D 1/722* | (2006.01) | |
| *C11D 3/43* | (2006.01) | |
| *C11D 3/30* | (2006.01) | |

(Continued)

(52) U.S. Cl.
CPC .............. *G03F 7/405* (2013.01); *C11D 1/72* (2013.01); *C11D 1/722* (2013.01); *C11D 3/30* (2013.01); *C11D 3/43* (2013.01); *C11D 11/0047* (2013.01); *G03F 7/2004* (2013.01); *G03F 7/2053* (2013.01); *G03F 7/32* (2013.01); *H01L 21/0274* (2013.01)

(58) Field of Classification Search
CPC ....... G03F 7/004; G03F 7/40; H01L 21/0271; H01L 21/0206; C11D 11/0047
USPC ..... 430/270.1, 322, 325, 329, 331; 510/175, 510/176, 367, 372, 375, 432; 134/1.2, 134/1.3
See application file for complete search history.

(56) References Cited

U.S. PATENT DOCUMENTS

| | | | |
|---|---|---|---|
| 2014/0256155 A1* | 9/2014 | Ting ...................... | G03F 7/423 438/778 |
| 2014/0315778 A1* | 10/2014 | Yianakopoulos ........ | C11D 1/72 510/470 |

\* cited by examiner

*Primary Examiner* — Amanda C Walke
(74) *Attorney, Agent, or Firm* — Sughrue Mion, PLLC

(57) ABSTRACT

Disclosed are a cleaning composition for photolithography and a method of forming a photoresist pattern using the same. The cleaning composition, necessary for forming a photoresist pattern having a high aspect ratio, includes water and a compound represented by Chemical Formula 1 below:

[Chemical Formula 1]

$$R-\left[\begin{array}{c}H\\|\\\end{array}O\right]_x\left[\begin{array}{c}O\\|\\\end{array}\right]_y\sim\sim_z OH$$

wherein R is H or OH, x is an integer selected from 1 to 100, y is an integer selected from 0 to 100, and z is an integer selected from 0 to 100. This cleaning composition is useful for forming a pattern using any of a variety of light sources, and also, even when it is difficult to form a fine pattern as desired using a (Continued)

photoresist alone, a fine pattern can be realized at a desired level of fineness and production costs can be reduced.

5 Claims, 3 Drawing Sheets

(51) Int. Cl.
*G03F 7/20* (2006.01)
*G03F 7/32* (2006.01)
*H01L 21/027* (2006.01)
*C11D 1/72* (2006.01)
*C11D 11/00* (2006.01)

FIG. 3
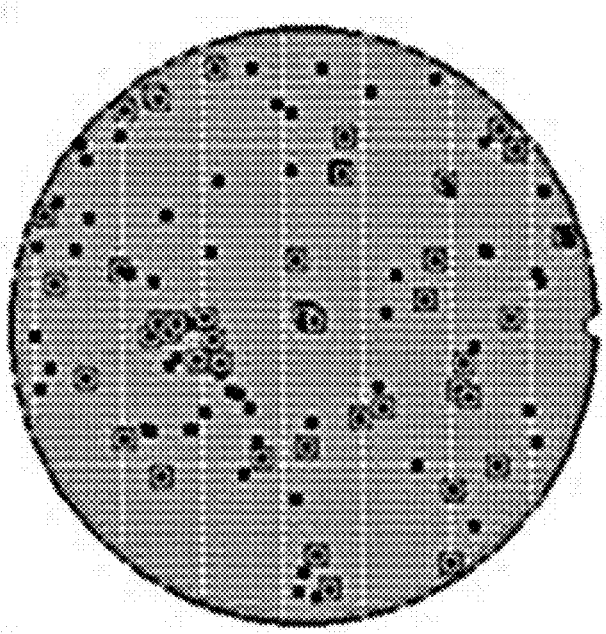
Example 2
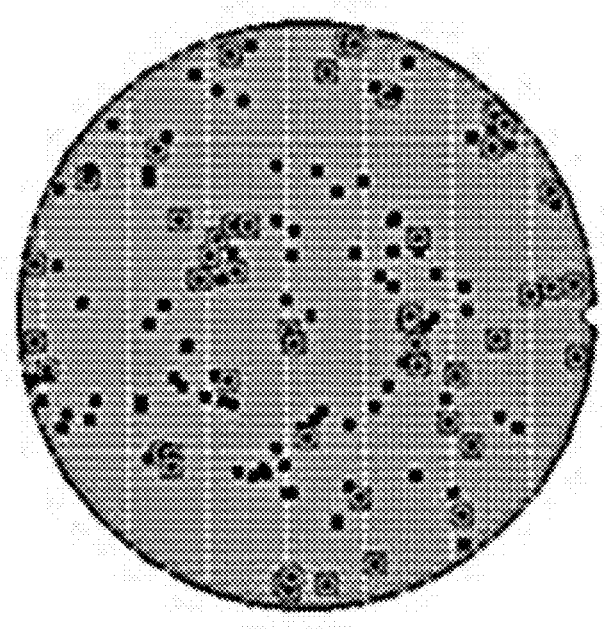
No cleaning solution

CLEANING COMPOSITION FOR PHOTOLITHOGRAPHY AND METHOD OF FORMING PHOTORESIST PATTERN USING THE SAME

CROSS REFERENCE TO RELATED APPLICATIONS

This application claims priority based on Korean Patent Application No. 10-2015-0101689, filed Jul. 17, 2015, the contents of all of which are incorporated herein by reference in its entirety.

BACKGROUND OF THE INVENTION

1. Field of the Invention

The present invention relates to a cleaning composition for photolithography and a method of forming a photoresist pattern using the same and, more particularly, to a cleaning composition, necessary for forming a photoresist pattern having a high aspect ratio, and a method of forming a photoresist pattern using the same.

2. Description of the Related Art

With the increase in the demand for electronic devices having superior performance, the precision of integrated circuits or system circuits, which are key elements used for electronic devices, is required to be finer. As such, pattern fineness is regarded as an important factor that has an influence on the precision of integrated circuits or system circuits.

Currently, photolithography is typically employed to form fine patterns, and photoresist patterns have to possess a high aspect ratio in order to realize fine patterns.

When the aspect ratio of the photoresist pattern is increased, the pattern may easily collapse. The reason why a photoresist pattern having a high aspect ratio easily collapses is that deionized water does not tend to be uniformly removed from a pattern having a high aspect ratio owing to the high surface tension of deionized water upon cleaning the developed photoresist using deionized water, and thus the pattern becomes collapsed because of the difference in force that is imposed on the pattern.

In the formation of a fine pattern, it is difficult to remove defects from the patterned photoresist after the development process. Particularly, defects caused in the process of forming a fine pattern at high cost negatively affect the final products, undesirably increasing production costs.

With the goal of preventing collapse of the pattern and removing defects during the formation of the fine pattern, many attempts have been made to improve the performance of the photoresist or the photolithography process. As for the photolithography process, a cleaning solution is used after the development process to prevent the photoresist pattern from collapsing and to remove the defects. The use of the cleaning solution to prevent the collapse of the fine pattern and to reduce the incidence of defects is advantageous because the existing photoresist may be used as it is, and the processing margin may be improved by the use of the cleaning solution, thus expecting an increase in yield.

SUMMARY OF THE INVENTION

Accordingly, the present invention has been made keeping in mind the above problems encountered in the related art, and an object of the present invention is to provide a cleaning composition, wherein, during the formation of a fine pattern, the pattern may be prevented from collapsing after the development of a photoresist, and the incidence of defects may be reduced.

Another object of the present invention is to provide a method of forming a photoresist pattern having high quality.

In order to accomplish the above objects, the present invention provides a cleaning composition for photolithography, comprising water and a compound represented by Chemical Formula 1 below:

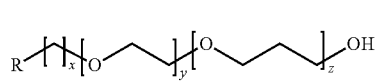

[Chemical Formula 1]

wherein R is H or OH,
x is an integer selected from 1 to 100,
y is an integer selected from 0 to 100, and
z is an integer selected from 0 to 100.

In the present invention, the compound represented by Chemical Formula 1 may be contained in an amount of 1 to 10,000 ppm, and preferably 1 to 1,000 ppm.

In the present invention, the cleaning composition may further include a water-soluble organic solvent.

In the present invention, the water-soluble organic solvent may be selected from the group consisting of methanol, ethanol, benzyl alcohol, isopropyl alcohol, isoamyl alcohol, 2-propanol, 1-pentanol, isobutyl alcohol, butyl alcohol, cetyl alcohol, lauryl alcohol, nonyl alcohol, and undecyl alcohol.

In the present invention, the cleaning composition may further include an ammonium hydroxide.

In the present invention, the ammonium hydroxide may be selected from the group consisting of ammonium hydroxide, tetrakis(decyl)ammonium hydroxide, tetrakis(2-hydroxyethyl)ammonium hydroxide, tetramethyl ammonium hydroxide, tetrabutyl ammonium hydroxide, benzyltrimethyl ammonium hydroxide, and trimethylvinyl ammonium hydroxide.

In addition, the present invention provides a method of forming a photoresist pattern, comprising: (a) applying a photoresist on a semiconductor substrate to form a photoresist film; (b) subjecting the photoresist film to exposure and development, thus forming a photoresist pattern; and (c) cleaning the photoresist pattern using the above cleaning composition.

In the present invention, the subjecting the photoresist film to exposure may be performed using an exposure source selected from the group consisting of KrF, ArF and EUV.

According to the present invention, the cleaning composition for photolithography can be useful for forming a pattern using any of a variety of light sources. In particular, even when it is difficult to form a fine pattern as desired using a photoresist alone, a fine pattern can be realized at a desired level of fineness, and production costs can be reduced.

BRIEF DESCRIPTION OF THE DRAWINGS

The above and other objects, features and advantages of the present invention will be more clearly understood from the following detailed description taken in conjunction with the accompanying drawings, in which:

FIG. 3 illustrates the results of measuring, by means of a KLA system, the prevention of missing hole defects when using the cleaning composition according to an embodiment of the present invention.

DESCRIPTION OF THE PREFERRED EMBODIMENTS

Figure 1:
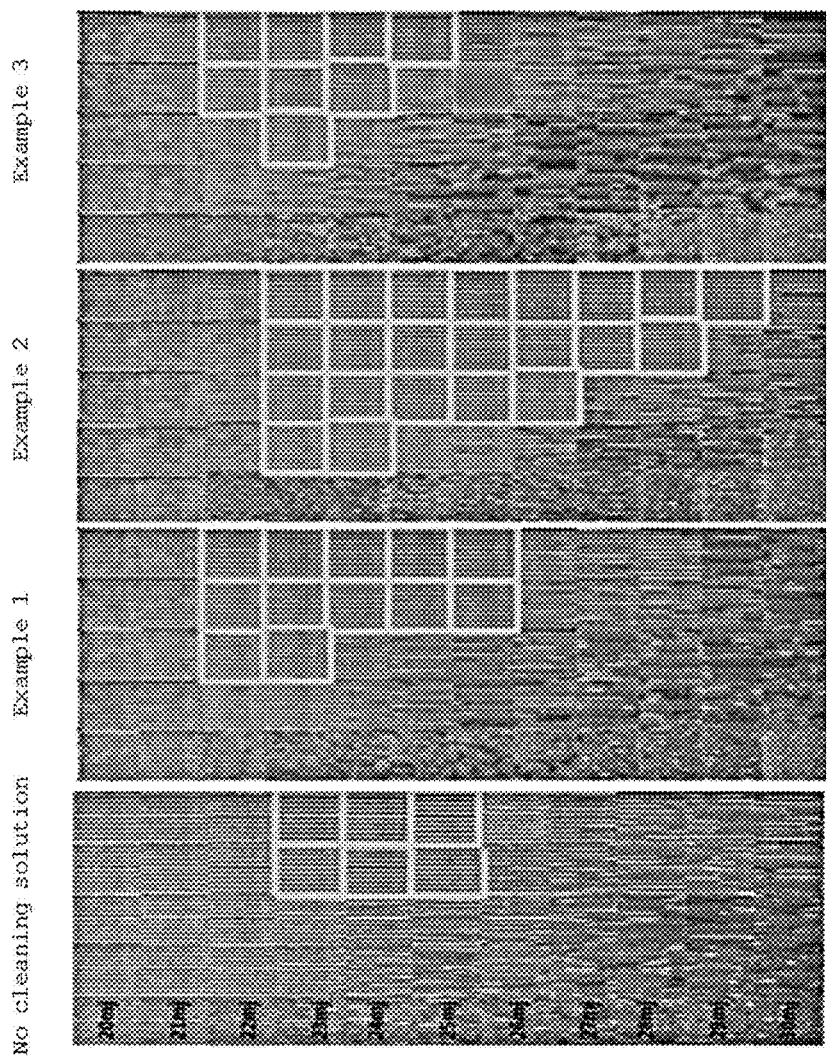
FIG. 1 illustrates critical dimension scanning electron microscope (CD-SEM) images showing the results of measuring the prevention of collapse of a pattern when using the cleaning composition according to an embodiment of the present invention.

The present invention is intended to use a cleaning composition for photolithography, including, as a surfactant, a compound composed of a lipophilic group and a hydrophilic group in the molecule thereof, so that the surface tension of deionized water may be significantly reduced, thereby preventing a photoresist pattern from collapsing.

In the present invention, a cleaning composition is provided, which includes a compound comprising an ethylene oxy group and/or a propylene oxy group as a surfactant, after which a photoresist is developed and a photoresist pattern is then cleaned using the above cleaning composition. Ultimately, the collapse of the photoresist pattern can be assuredly prevented when using the above cleaning composition.

Therefore, an aspect of the present invention addresses a cleaning composition for photolithography, comprising water and a compound represented by Chemical Formula 1 below.

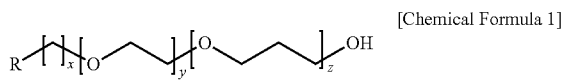

[Chemical Formula 1]

In Chemical Formula 1, R is H or OH,
x is an integer selected from 1 to 100,
y is an integer selected from 0 to 100, and
z is an integer selected from 0 to 100.

The compound represented by Chemical Formula 1, which serves as a surfactant, is composed of alkane, which is a lipophilic group, and ethoxy and propoxy, which are hydrophilic groups, thus significantly reducing the surface tension of deionized water. Furthermore, when the compound is a liquid having a predetermined molecular weight or less, it is readily dissolved in water and thus may be easily mixed with other compounds.

Preferably, in Chemical Formula 1, x is an integer selected from 1 to 20, y is an integer selected from 0 to 20, and z is an integer selected from 0 to 20. Although the effects may vary depending on the ratio of each of x, y, and z, if each integer exceeds a certain range, the resulting compound is difficult to dissolve in water, and the interaction with the photoresist is deficient or excessive, undesirably deteriorating the results compared to when cleaning is performed using deionized water alone.

Although the surface tension of the cleaning composition needs to decrease in order to prevent the collapse of the pattern, the collapse of the pattern may not be prevented even when the surface tension level is unconditionally low. To simply decrease the surface tension level, the amount of the surfactant of the cleaning composition may be increased. In the case where the amount of the surfactant is increased, side effects, including the dissolution of the photoresist pattern, may occur. Hence, it is important to control the kind and amount of surfactant in the cleaning composition for photolithography.

In the present invention, the cleaning composition for photolithography includes a compound represented by Chemical Formula 1 in an amount of 1 to 10,000 ppm, and preferably 1 to 1,000 ppm. That is, the amount of the compound represented by Chemical Formula 1 is 0.0001 to 1 wt %, and preferably 0.001 to 1 wt %, based on the total weight of the cleaning composition.

If the amount of the compound represented by Chemical Formula 1 is less than 1 ppm or exceeds 10,000 ppm, it is impossible to prevent collapse of the photoresist pattern.

In the present invention, the water is not particularly limited, but the use of deionized water is preferable.

In order to increase the ability to remove defects from the photoresist pattern, the cleaning composition of the present invention may further comprise an additive, in addition to the surfactant.

The additive may include, for example, a water-soluble organic solvent and an ammonium hydroxide compound.

Examples of the water-soluble organic solvent may include, but are not limited to, methanol, ethanol, benzyl alcohol, isopropyl alcohol, isoamyl alcohol, 2-propanol, 1-pentanol, isobutyl alcohol, butyl alcohol, cetyl alcohol, lauryl alcohol, nonyl alcohol, and undecyl alcohol, which may be used alone or in combination.

The amount of the organic solvent is preferably 0.0001 to 10 wt % based on the total weight of the cleaning composition.

The ammonium hydroxide compound may be provided in the form in which an alkyl compound is bound to an amine group, and examples thereof may include, but are not limited to, ammonium hydroxide, tetrakis(decyl)ammonium hydroxide, tetrakis(2-hydroxyethyl)ammonium hydroxide, tetramethyl ammonium hydroxide, tetrabutyl ammonium hydroxide, benzyltrimethyl ammonium hydroxide, and trimethylvinyl ammonium hydroxide, which may be used alone or in combination.

The amount of the ammonium hydroxide is preferably 0.0001 to 10 wt % based on the total weight of the cleaning composition.

If the amount of the additive is less than 0.0001 wt % based on the total weight of the cleaning composition, the effect of removing defects from the photoresist pattern is insignificant. On the other hand, if the amount thereof exceeds 10 wt %, the pattern may collapse.

According to the present invention, the cleaning composition for photolithography may be composed of i) 0.0001 to 1 wt % of the compound represented by Chemical Formula 1, ii) 0.0001 to 1 wt % of the ammonium hydroxide compound, iii) 0.0001 to 10 wt % of an alcohol compound, and iv) 88 to 99.9997 wt % of water.

The cleaning composition according to the present invention may be one that is typically applied to the process of forming a photoresist pattern using a developing solution.

Another aspect of the present invention addresses a method of forming a photoresist pattern, comprising: (a) applying a photoresist on a semiconductor substrate to form a photoresist film; (b) subjecting the photoresist film to exposure and development, thus forming a photoresist pattern; and (c) cleaning the photoresist pattern using the cleaning composition prepared as described above.

The exposure process is not particularly limited, but is preferably performed using KrF (248 nm), ArF (193 nm), EUV (13 nm), or an E-beam as an exposure source.

In the present invention, the cleaning process using the cleaning composition is performed in the last stage of the development process, thus aiding in the formation of the pattern to thereby increase the processing margin.

EXAMPLES

A better understanding of the present invention may be obtained through the following examples which are merely set forth to illustrate, but are not to be construed to limit the scope of the present invention, as is apparent to those skilled in the art.

Examples 1 to 3: Preparation of Cleaning Composition

Example 1

0.01 g of a compound of Chemical Formula 1, in which R is H, x is 12, y is 7, and z is 0, 0.01 g of tetrabutyl ammonium hydroxide, and 1 g of isopropyl alcohol were mixed with 98.98 g of deionized water, yielding a cleaning composition.

Example 2

0.01 g of a compound of Chemical Formula 1, in which R is H, x is 12, y is 9, and z is 0, 0.01 g of tetrabutyl ammonium hydroxide, and 1 g of isopropyl alcohol were mixed with 98.98 g of deionized water, yielding a cleaning composition.

Example 3

0.01 g of a compound of Chemical Formula 1, in which R is H, x is 12, y is 9, and z is 1, 0.01 g of tetrabutyl ammonium hydroxide, and 1 g of isopropyl alcohol were mixed with 98.98 g of deionized water, yielding a cleaning composition.

Example 4

0.01 g of a compound of Chemical Formula 1, in which R is OH, x is 12, y is 9, and z is 0, 0.01 g of tetrabutyl ammonium hydroxide, and 1 g of isopropyl alcohol were mixed with 98.98 g of deionized water, yielding a cleaning composition.

Test Examples 1 to 3: Performance of Cleaning Composition for Preventing Collapse of Pattern Each of the cleaning compositions of Examples 1 to 3 was applied in a sufficient amount on a developed photoresist micropattern, which was then rotated, after which the collapse of the pattern was observed using a CD-SEM (HI-TACH). The results are shown in Table 1 below and in FIG. 1. The collapse of the pattern can be seen by use of CD-SEM. When the pattern collapses, it is observed to appear poor in the CD-SEM image.

TABLE 1

| Cleaning composition | No cleaning solution | Ex. 1 | Ex. 2 | Ex. 3 |
|---|---|---|---|---|
| Total pattern evaluation zone | 55 | 55 | 55 | 55 |
| Pattern non-collapse zone | 6 | 12 | 22 | 8 |

As is apparent from Table 1 and FIG. 1, when the cleaning composition according to the present invention was used, the pattern was prevented from collapsing.

Test Examples 4 and 5: Performance of Cleaning Composition for Reducing the Number of Pattern Defects Each of the cleaning compositions of Examples 2 and 4 was applied in a sufficient amount on a developed photoresist micropattern, which was then rotated, after which the reduction in the number of defects was measured using a KLA system (made by KLA). The results are shown in Table 2 below and in FIG. 2.

TABLE 2

| Cleaning composition | No cleaning solution | Ex. 2 | Ex. 4 |
|---|---|---|---|
| Bridge defects | 24 | 4 | 12 |
| Gel defects | 7 | 6 | 5 |
| Bending defects | 5 | 0 | 2 |

Figure 2:
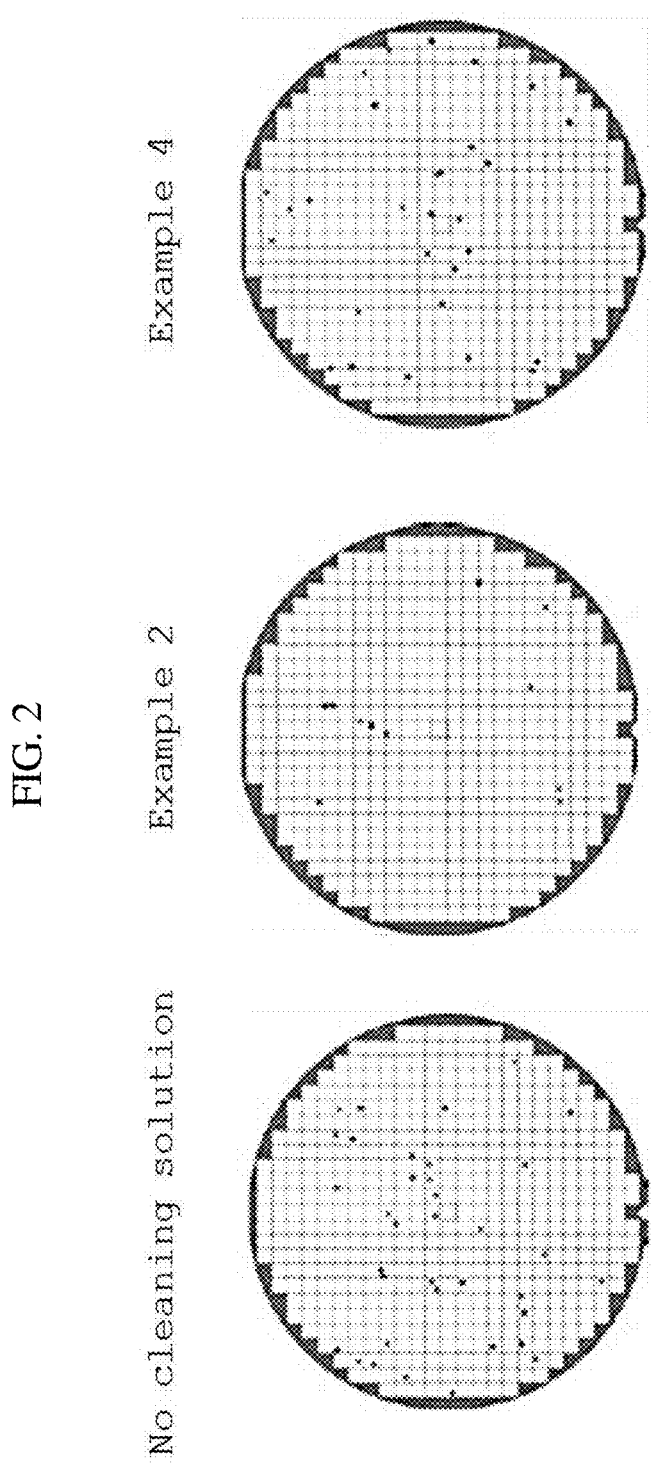
FIG. 2 illustrates the results of measuring, by means of a KLA system, the prevention of bridge defects, gel defects, and bending defects when using the cleaning composition according to an embodiment of the present invention.

As is apparent from Table 2 and FIG. 2, compared to when no cleaning solution was used, when the photoresist pattern was formed using the cleaning solution, the incidence of bridge defects, gel defects, and bending defects was reduced.

Test Example 6: Performance of Cleaning Composition for Reducing the Number of Missing Hole Defects The cleaning composition of Example 2 was applied in a sufficient amount on a developed photoresist hole pattern, which was then rotated, after which the reduction in the number of defects was measured using a KLA system (made by KLA). The results are shown in Table 3 below and in FIG. 3.

TABLE 3

| Cleaning composition | No cleaning solution | Ex. 2 |
|---|---|---|
| Missing hole defects | 32 | 0 |

As is apparent from Table 3 and FIG. 3, when no cleaning solution was used, the number of missing hole defects was 32. When the cleaning composition according to the present invention was used, missing hole defects did not occur.

Although specific embodiments of the present invention have been disclosed in detail as described above, it is obvious to those skilled in the art that such description is merely of preferable exemplary embodiments and is not construed to limit the scope of the present invention. Therefore, the substantial scope of the present invention will be defined by the appended claims and equivalents thereof.

What is claimed is:

1. A cleaning composition for photolithography, suitable for preventing a photoresist pattern from collapsing, the cleaning composition comprising:
a compound of the following, Chemical Formula 1:

Chemical Formula 1

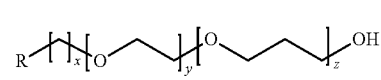

wherein R is H or OH,
x is 12,
y is 7 or 9, and
z is 0 or 1;

a water-soluble organic solvent;
an ammonium hydroxide; and
dionized water,
wherein the compound of Chemical Formula 1 of is contained in an amount of 1 to 1,000 ppm,
the water-soluble organic solvent is isopropyl alcohol, and the ammonium hydroxide is tetrabutyl ammonium hydroxide.

2. The cleaning composition of claim 1, wherein the cleaning composition comprises 0.01 wt % of the compound of Chemical Formula 1, 1 wt % of isopropyl alcohol, 0.01 wt % of tetrabutyl ammonium hydroxide, and 98.98 wt % of deionized water.

3. A method of forming a photoresist pattern, comprising:
  (a) applying a photoresist on a semiconductor substrate to form a photoresist film;
  (b) subjecting the photoresist film to exposure and development, thus forming a photoresist pattern; and
  (c) cleaning the photoresist pattern using the cleaning composition of claim 1, in order to prevent the photoresist pattern from collapsing.

4. The method of claim 3, wherein the subjecting the photoresist film to exposure is performed using an exposure source selected from the group consisting of KrF, ArF and EUV.

5. The method of claim 3, wherein the cleaning of the photoresist pattern is performed using the cleaning composition comprising 0.01 wt % of the compound of Chemical Formula 1, 1 wt % of isopropyl alcohol, 0.01 wt % of tetrabutyl ammonium hydroxide, and 98.98 wt % of deionized water.

* * * * *